United States Patent [19]

Tomioka et al.

[11] Patent Number: 5,413,895
[45] Date of Patent: May 9, 1995

[54] POSITIVE RESIST COMPOSITION COMPRISING A QUINONE DIAZIDE SULFONIC ACID ESTER, A NOVOLAK RESIN AND A POLYPHENOL COMPOUND.

[75] Inventors: Jun Tomioka, Hyogo; Koji Kuwana, Osaka; Hirotoshi Nakanishi, Osaka; Yasunori Uetani, Osaka; Ayako Ida, Hyogo, all of Japan

[73] Assignee: Sumitomo Chemical Company, Limited, Osaka, Japan

[21] Appl. No.: 931,316

[22] Filed: Aug. 18, 1992

[30] Foreign Application Priority Data

Aug. 21, 1991 [JP] Japan .................. 3-209357
Jul. 6, 1992 [JP] Japan .................. 4-178137

[51] Int. Cl.$^6$ .................. G03F 7/023; G03F 7/30
[52] U.S. Cl. .................. 430/191; 430/165; 430/192; 430/193
[58] Field of Search .................. 430/192, 193, 165, 191

[56] References Cited

U.S. PATENT DOCUMENTS

| | | | |
|---|---|---|---|
| 4,731,319 | 3/1988 | Kohara et al. | 430/165 |
| 4,812,551 | 3/1989 | Oi et al. | 430/192 |
| 5,019,479 | 5/1991 | Oka et al. | 430/193 |
| 5,128,230 | 7/1992 | Templeton et al. | 430/192 |
| 5,178,986 | 1/1993 | Zampini et al. | 430/191 |
| 5,340,686 | 8/1994 | Sakaguchi et al. | 430/192 |

FOREIGN PATENT DOCUMENTS

| | | |
|---|---|---|
| 0445819 | 3/1991 | European Pat. Off. . |
| 0445819 | 9/1991 | European Pat. Off. . |
| 3200251 | 9/1991 | Japan . |
| 3200255 | 9/1991 | Japan . |
| 3259149 | 11/1991 | Japan . |
| 9007538 | 7/1990 | WIPO . |

OTHER PUBLICATIONS

Patent Abstract Of Japan, vol. 11, No. 181 (P-585) (2628) 11 Jun. 1987 & JP-A-62 010 646 (Kanto Kagaku K.K.).

Primary Examiner—Charles L. Bowers, Jr.
Assistant Examiner—John S. Chu
Attorney, Agent, or Firm—Birch, Stewart, Kolasch & Birch

[57] ABSTRACT

A positive resist composition comprising an alkali-soluble resin containing a novolak resin which is obtained by a condensation reaction of a phenol compound and a carbonyl compound and has an area in a GPC pattern of a range in that a molecular weight as converted to polystyrene is not larger than 900 not exceeding 20% of a whole pattern area excluding the unreacted phenol compound, a quinonediazide compound and a polyphenol compound of the formula:

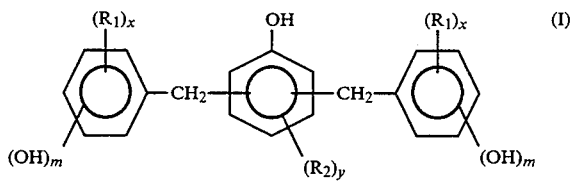

in which $R_1$ and $R_2$ are independently a hydrogen atom, a halogen atom, an alkyl group, an alkoxy group or a group: —$OCOR_3$ in which $R_3$ is an alkyl group or a phenyl group, x and y are independently an integer of 1 to 3, and m is an integer of 0 to 4, wherein a weight ratio of said polyphenol compound (I) to said alkali-soluble resin is from 3:10 to 5:10, which is excellent in heat resistance, sensitivity, resolution and a depth of focus and leaves no scum after development.

9 Claims, No Drawings

POSITIVE RESIST COMPOSITION COMPRISING A QUINONE DIAZIDE SULFONIC ACID ESTER, A NOVOLAK RESIN AND A POLYPHENOL COMPOUND.

BACKGROUND OF THE INVENTION

1. Field of the Invention

The present invention relates to a positive resist composition. More particularly, the present invention relates to a positive resist composition which is sensitive to ultraviolet light, far ultraviolet light (including excimer laser), electron beam, ion beam, X-ray and the like.

2. Description of the Related Art

Recently, with a rise in the integration level of integrated circuits, formation of patterns of submicron order is required, and it is desired to provide a positive resist composition which is excellent in various properties such as depth of focus, profile, developing residue (scum), heat resistance, sensitivity and resolution. In particular, for the production of 16–64 MDRAMs, it is necessary to resolve a pattern having a line width of 0.5 $\mu$m or less with a good profile and a broad depth of focus.

The resolution can be improved by, for example, increasing the amount of a sensitizer. However, this method will increase the amount of scum undesirably. To improve the resolution without increasing the amount of scum, the use of a novolak resin having a specific molecular weight distribution is proposed (cf. Japanese Patent Kokai Publication No. 105243/1989 corresponding to U.S. Pat. No. 4,812,551). However, this method is insufficient in view of the depth of focus.

Hitherto, it has been very difficult to resolve patterns having line widths of 0.5 $\mu$m or less with a good profile and a broad depth of focus.

SUMMARY OF THE INVENTION

An object of the present invention is to provide a positive resist composition which is excellent in various properties such as a depth of focus, resolution and heat resistance and leaves no scum.

According to the present invention, there is provided a positive resist composition comprising an alkali-soluble resin, containing: a novolak resin which is obtained by a condensation reaction of a phenol compound and a carbonyl compound, having an area of a GPC pattern in which the range of molecular weights, as compared to polystyene, which are less than 900, does exceed 20% of the whole pattern area, excluding the unreacted phenol compound; a quinonediazide compound; and a polyphenol compound of the formula:

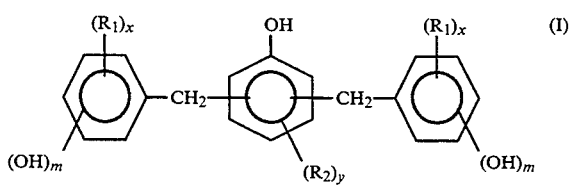

wherein $R_1$ and $R_2$ are independently a hydrogen atom, a halogen atom, an alkyl group, an alkoxy group or a group: —OCOR$_3$ in which $R_3$ is an alkyl group or a phenyl group, x and y are independently an integer of 1 to 3, and m is an integer of 0 to 4, wherein a weight ratio of said polyphenol compound (I) to said alkali-soluble resin is from 3:10 to 5:10.

DESCRIPTION OF THE INVENTION

In the formula (I), the alkyl or alkoxy group for $R_1$ and $R_2$ or the alkyl group for $R_3$ may be a straight or branched one having 1 to 5 carbon atoms. Preferably, $R_1$ or $R_2$ is a hydrogen atom, a methyl group or an ethyl group. As $R_3$, a methyl group or an ethyl group is preferred.

A preferred example of the polyphenol compound (I) is a compound of the formula:

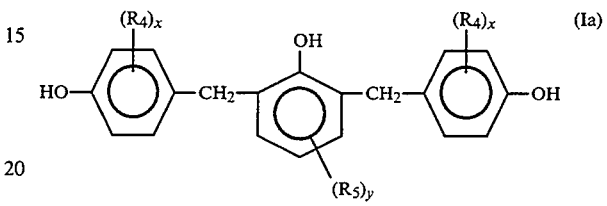

wherein $R_4$ and $R_5$ are independently a hydrogen atom or an alkyl group, and x and y are the same as defined above.

Specific examples of the compound (Ia) are a compound of the formula:

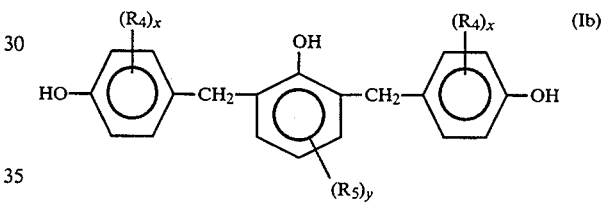

wherein $R_4$, $R_5$, x and y are the same as defined above, and a compound of the formula:

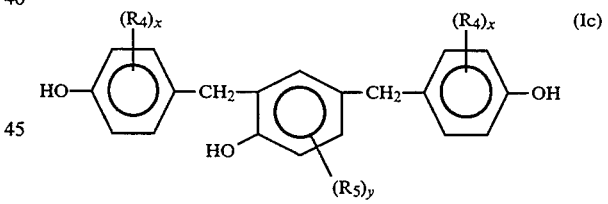

wherein $R_4$, $R_5$, x and y are the same as defined above.

Preferred examples of the compound (Ia) are as follows:

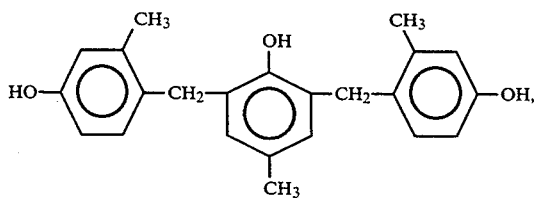

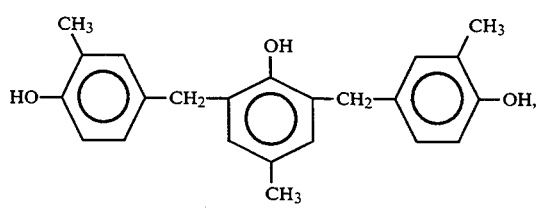

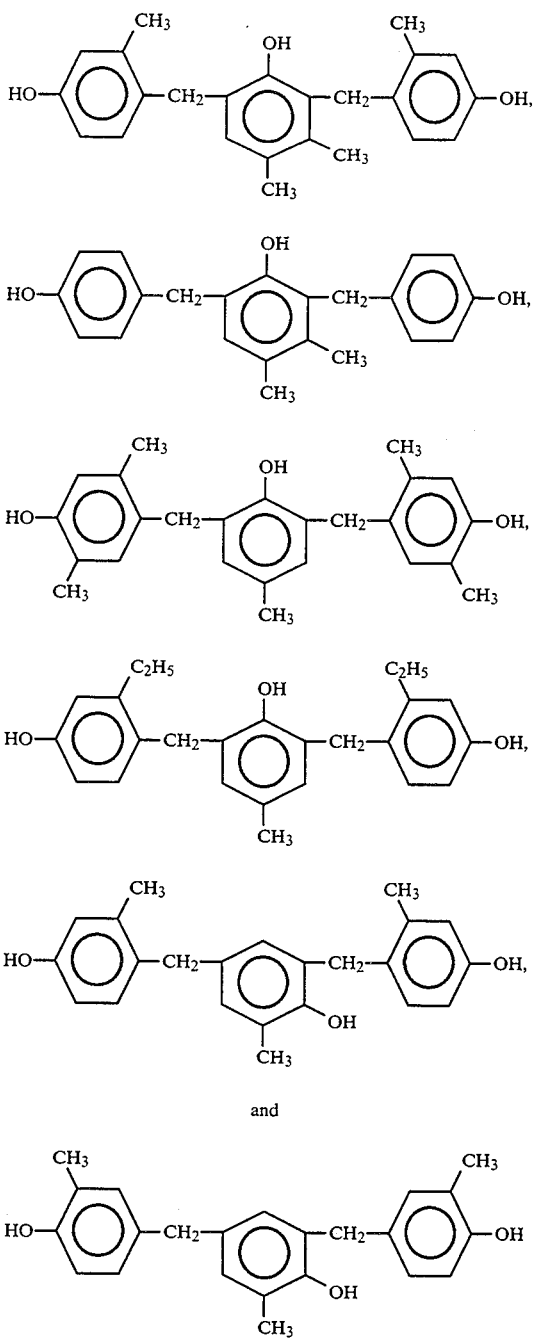

and

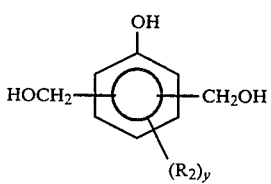

The polyphenol compound (I) may be prepared by reacting a compound of the formula:

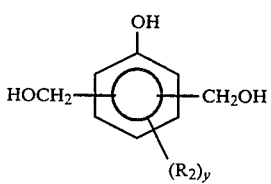

wherein $R_2$ and $y$ are the same as defined above, with a compound of the formula:

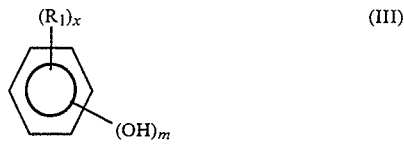

wherein $R_1$, $x$ and $m$ are the same as defined above in a solvent (e.g. methanol, toluene, etc.) in the presence of an acid catalyst (e.g. hydrochloric acid, sulfuric acid, etc.)

The polyphenol compound (I) is used in an amount of 30 to 50 parts by weight per 100 parts by weight of the alkali-soluble resin. When the amount of the polyphenol compound (I) is smaller than 30 parts by weight per 100 parts by weight of the alkali-soluble resin, the resolution is greatly deteriorated. When this amount is larger than 50 parts by weight per 100 parts by weight of the alkali-soluble resin, not only the resolution is deteriorated and the scum is generated, but also the heat resistance is significantly decreased.

As the quinone diazide compound, there are exemplified 1,2-benzoquinonediazide-4-sulfonic acid esters, 1,2-naphthoquinonediazide-4-sulfonic acid esters, 1,2-naphthoquinonediazide-5-sulfonic acid esters and the like are exemplified. These esters may be prepared by a condensation reaction of a quinonediazidesulfonyl halide such as 1,2-naphthoquinonediazidesulfonyl chloride or benzoquinonediazidesulfonyl chloride with a compound having a hydroxyl group in the presence of a weak alkali.

Specific examples of the compound having a hydroxyl group are hydroquinone, resorcinol, phloroglucin, 2,4-dihydroxybenzophenone, trihydroxybenzophenones (e.g. 2,3,4-trihydroxybenzophenone, 2,2',3-trihydroxybenzophenone, 2,2',4-trihydroxybenzophenone, 2,2',5-trihydroxybenzophenone, 2,3,3'-trihydroxybenzophenone, 2,3,4'-trihydroxybenzophenone, 2,3',4-trihydroxybenzophenone, 2,3',5-trihydroxybenzophenone, 2,4,4'-trihydroxybenzophenone, 2,4',5-trihydroxybenzophenone, 2',3,4-trihydroxybenzophenone, 3,3',4-trihydroxybenzophenone, 3,4,4'-trihydroxybenzophenone, etc.), tetrahydroxybenzophenones (e.g. 2,3,3',4-tetrahydroxybenzophenone, 2,3,4,4'-tetrahydroxybenzophenone, 2,2',4,4'-tetrahydroxybenzophenone, 2,2',3,4-tetrahydroxybenzophenone, 2,2',3,4'-tetrahydroxybenzophenone, 2,2',5,5'-tetrahydroxybenzophenone, 2,3',4',5-tetrahydroxybenzophenone, 2,3',5,5'-tetrahydroxybenzophenone, etc.), pentahydroxybenzophenones (e.g. 2,2',3,4,4'-pentahydroxybenzophenone, 2,2',3,4,5'-pentahydroxybenzophenone, 2,2',3,3',4-pentahydroxybenzophenone, 2,3,3',4,5'-pentahydroxybenzophenone, etc.), hexahydroxybenzophenones (e.g. 2,3,3',4,4',5'-hexahydroxybenzophenone, 2,2',3,3',4,5'-hexahydroxybenzophenone, etc.), alkyl gallares, oxyfravans disclosed in Japanese Patent Kokai Publication No. 84650/1990 (corresponding to U.S. Pat. No. 5,059,507), phenol compounds disclosed in Japanese Patent Kokai Publication No. 269351/1990 (corresponding to European Patent Publication No. 341 608A) and phenol compounds disclosed in Japanese Patent Kokai Publication No. 185447/1991 (corresponding to U.S. patent Ser. No. 07/743,299) and the like.

An amount of the quinonediazide compound is from 5 to 50% by weight, preferably 10 to 40% by weight based on a total weight of the solid components in the positive resist composition.

Examples of the novolak resin are those prepared by condensation reacting, by a conventional method, a carbonyl compound with at least one phenol compound selected from the group phenol, o-cresol, m-cresol, p-cresol, 2,5-xylenol, 3,5-xylenol, 3,4-xylenol, 2,3,5-trimethylphenol, 4-tert.-butylphenol, 2-tert.-butylphenol, 3-tert.-butylphenol, 3-ethylphenol, 2-ethylphenol, 4-ethylphenol, 3-methyl-6-tert.-butylphenol, 4-methyl-2-tert.-butylphenol, 2-naphthol, 1,3-dihydroxynaphthalene, 1,7-dihydroxynaphthalene, 1,5-dihydroxynaphthalene, a phenol compound of the formula:

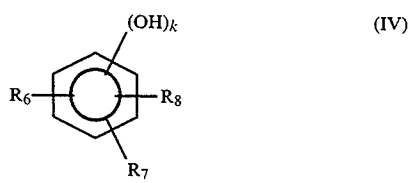

wherein $R_6$, $R_7$ and $R_8$ are independently a hydrogen atom or a $C_1$–$C_4$ alkyl or alkoxy group, and k is 1 or 2 and a compound of the formula:

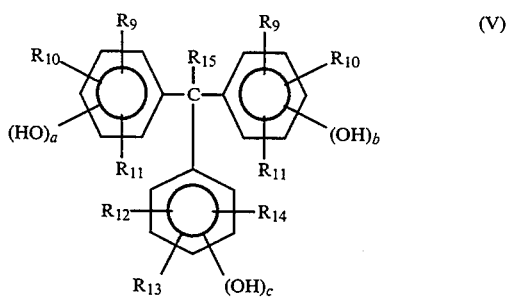

wherein $R_9$ to $R_{14}$ are independently a hydrogen atom or a $C_1$–$C_4$ alkyl or alkoxy group, $R_{15}$ is a hydrogen atom or a $C_1$–$C_4$ alkyl group or an aryl group and a, b and c are independently 0, 1 or 2 provided that the sum of a, b and c is larger than 2.

Examples of the carbonyl compound are formaldehyde, paraformaldehyde, acetaldehyde, propylaldehyde, benzaldehyde, phenylacetaldehyde, α-phenylpropylaldehyde, β-phenylpropylaldeh o-hydroxybenzaldehyde, m-hydroxybenzaldehyde, p-hydroxybenzaldehyde, o-methylbenzaldehyde, p-methylbenzaldehyde, glutaraldehyde and glyoxal.

In view of the resolution, the heat resistance and the scum, the novolak resin is treated by, for example, fractionation, so that the area in a GPC pattern (using a UV detector of 254 nm) of a range in which molecular weight, as compared to polystyrene, is less than 900, does not exceed 20%, preferably 15%, more preferably 10% of the whole pattern area excluding the unreacted phenol compound.

The novolak resin can be fractionated by dissolving the as-produced novolak resin in a good solvent such as alcohols (e.g. methanol, ethanol, etc.), ketones (e.g. acetone, methyl ethyl ketone, methyl isobutyl ketone, etc.), ethylene glycol or its ethers, ether esters (e.g. ethyl-cellosolve acetate, etc.), tetrahydrofuran and the like and pouring a resulting solution in water to precipitate the resin, or by pouring the solution in a solvent such as heptane or cyclohexane to separate it. A weight average molecular weight of the novolak resin after fractionation is preferably from 3000 to 20,000.

As the alkali-soluble resin other than the novolak resin, polyvinylphenol and the like are used. An amount of the other alkali-soluble resin is not limited insofar as the effects of the present invention are not deteriorated.

A total amount of the alkali-soluble resin including the novolak resin is from 60 to 90% by weight based on the total weight of the solid components in the positive resist composition.

If necessary, the positive resist composition may contain any of conventionally used additives such as a sensitizer, a compound of the formula (V), a surfactant, a stabilizer or a dye which makes a formed image more visible.

A solvent in which the components are dissolved is preferably one that evaporates at a suitable drying rate to give a uniform and smooth coating film. Such solvent includes glycoletheresters such as ethylcellosolve acetate and propyleneglycolmonomethylether acetate, solvents disclosed in Japanese Patent Kokai Publication No. 220056/1990, esters (e.g. ethyl pyruvate, n-amyl acetate, ethyl lactate, etc.), ketones (e.g. 2-heptanone, γ-butyrolactone, etc.) and the like. They may be used independently or as a mixture thereof.

An amount of the solvent is not limited insofar as the composition can form a uniform film on a wafer without pinholes or coating irregularity. Usually, the amount of the solvent is adjusted so that the solid content in the positive resist composition is from 3 to 50% by weight.

PREFERRED EMBODIMENTS OF THE INVENTION

The present invention will be illustrated by following Examples which do not intended to limit the scope of the present invention. In Examples, "parts" are by weight.

Synthesis Example 1

To a mixture of an equimolar mixture of m-cresol and p-cresol (270.4 g), methyl isobutyl ketone (252 g), 12% oxalic acid (37.5 g) and 90% acetic acid (83.3 g), 37% formalin (135.9 g) was dropwise added at 95° C. over 1 hour. After the addition of formalin, the mixture was heated under reflux for 15 hours. After cooling down to room temperature, the reaction mixture was washed with water, and a resulting organic layer was dehydrated to obtain a methyl isobutyl ketone solution. To this solution (472.9 g; solid content: 40% by weight), methyl isobutyl ketone (878.3 g) and n-heptane (931.7 g) were added and the mixture was stirred at 60° C. for 30 minutes and kept standing. After adding 2-heptanone (500 g) to a lower layer, the lower layer was concentrated to obtain a solution of a resin in 2-heptanone, which was analyzed by GPC. A polystrene-converted weight average molecular weight was 8000, and the area of a GPC, in which the range of molecular weights as compared to polystyrene, less than 900 was 9% of a whole pattern area of the novolak resin excluding the unreacted phenol compounds.

Synthesis Example 2

To a mixture of an equimolar mixture of m-cresol and p-cresol (270.4 g), methyl isobutyl ketone (252 g), 12% oxalic acid (37.5 g) and 90% acetic acid (83.3 g), 37% formalin (148.0 g) was dropwise added at 95° C. over 1 hour. After the addition of formalin, the mixture was heated under reflux for 19 hours. After cooling down to room temperature, the reaction mixture was washed with water, and a resulting organic layer was dehydrated to obtain a methyl isobutyl ketone solution. To this solution, 2-heptanone (1500 g) was added and the mixture was concentrated to obtain a solution of a resin in 2-heptanone, which was analyzed by GPC. A polystrene-converted weight average molecular weight was 8000, and the area of a GPC in which the range of molecular weights, as compared to polystyrene, less than 900 was 22% of a whole pattern area of the novolak resin excluding the unreacted phenol compounds.

Examples 1-6 and Comparative Examples 1-5

The novolak resin (referred to as "Resin" in Table), a quinonediazide compound (referred to as "Sensitizer" in Table) and a polyphenol compound (referred to as "Compound (I)" in Table) were mixed together with n-heptanone (50 parts) in amounts shown in Table, and filtrated through a polytetrafluoroethylene filter having a pore size of 0.2 μm to obtain a resist solution. Using a spinner, this resist solution was coated on a silicon wafer which had been rinsed in a usual way to form a resist film of 1.1 μm in thickness. Subsequently, the silicon wafer was baked at 90° C. for 60 seconds on a hot plate, and exposed to light having a wavelength of 365 nm (i line) while varying the exposure time stepwise by means of a reduction projection exposing apparatus (NSR 1775i 7 A with NA of 0.5 manufactured by Nicon). Thereafter, the silicon wafer was developed for one minute in a developing solution (SOPD manufactured by Sumitomo Chemical Co., Ltd.) to obtain a positive pattern.

Resolution was evaluated by observing, with a scanning electron microscope, a width of a line-and-space pattern which was separated without film thickness decrease at an exposure amount (effective sensitivity) at which a 0.5 μm line-and-space pattern was 1:1.

A depth of focus was determined by measuring, with a scanning electron microscope, a degree of focus shifting at which the 0.4 μm line-and-space pattern could be resolved at an effective sensitivity without film thickness decrease.

Heat resistance was evaluated by measuring a temperature at which a 3 μm line-and-space pattern started to deform when the silicon wafer was post baked on a hot plate for 3 minutes.

The results are shown in Table.

Example 2

C to F for Compound (I):

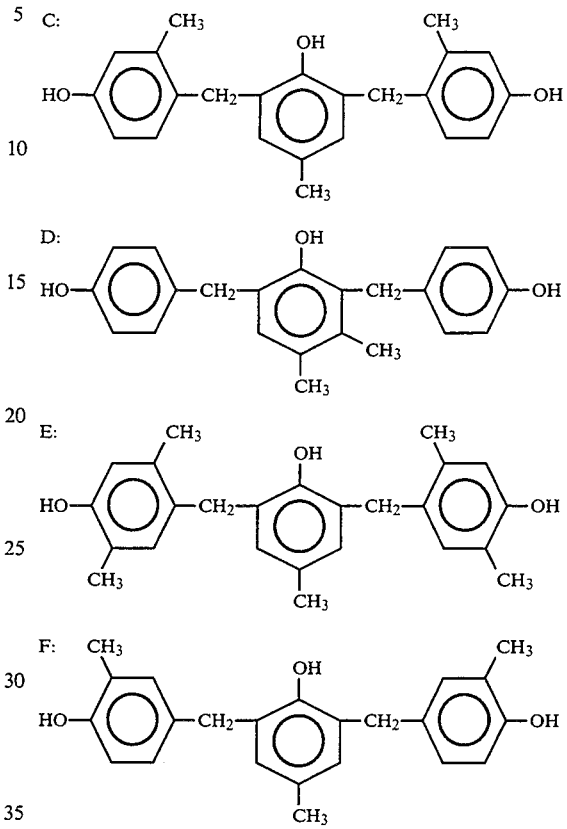

Sensitizer G: A condensation product of naphthoquinone-(1,2)-diazide-(2)-5-sulfonyl chloride with the following compound (a molar ratio of 2.6:1):

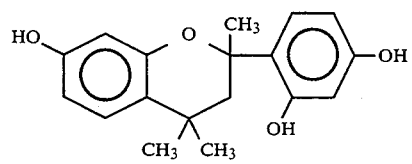

TABLE

| | Resist composition (parts) | | | Resist properties | | | | |
|---|---|---|---|---|---|---|---|---|
| Example No. | Resin | Compound (I) | Sensitizer | Heat resistance (°C.) | Resolution (μm) | Effective sensitivity (msec) | Depth of focus (μm) | Scum |
| 1 | A (10) | C (4) | G (3.5) | 135 | 0.35 | 400 | 1.2 | No |
| 2 | A (10) | D (4) | G (3.5) | 135 | 0.35 | 400 | 1.2 | No |
| 3 | A (10) | E (4) | G (3.5) | 135 | 0.375 | 450 | 1.0 | No |
| 4 | A (10) | F (4) | G (3.5) | 135 | 0.375 | 450 | 1.0 | No |
| 5 | A (10.5) | C (3.5) | G (3.5) | 140 | 0.375 | 450 | 1.0 | No |
| 6 | A (9.5) | C (4.5) | G (3.5) | 130 | 0.375 | 400 | 1.0 | No |
| C. 1 | A (12) | C (2) | G (3.5) | 140 | 0.45 | 550 | — | No |
| C. 2 | A (8.5) | C (5.5) | G (3.5) | 120 | 0.45 | 400 | — | Yes |
| C. 3 | B (14) | — | G (3.5) | 130 | 0.40 | 550 | 0.2 | Yes |
| C. 4 | B (10) | C (4) | G (3.5) | 110 | 0.45 | 350 | — | Yes |
| C. 5 | B (12) | C (2) | G (3.5) | 125 | 0.40 | 450 | 0.4 | Yes |

Notes:
Novolak Resin A: The resin prepared in Synthesis Example 1

Novolak Resin B: The resin prepared in Synthesis

What is claimed is:
1. A positive resist composition comprising in admixture:

i) an alkali-soluble resin containing a novolak resin obtained by condensing a phenol compound and a carbonyl compound, wherein the molecular weight range of said novolak resin does not exceed 20 area % of components<900 MW, excluding unreacted phenol compounds, as determined by the GPC pattern of said novolak resin, compared to polystyrene standards;

ii) a quinonediazide compound; and iii) a polyphenol compound of the formula:

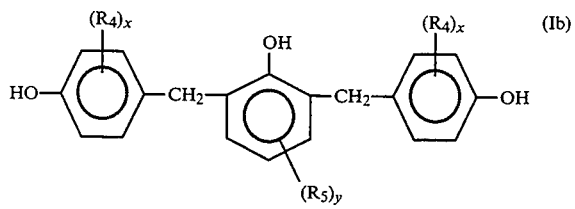

wherein $R_4$ and $R_5$ are independently a hydrogen atom or an alkyl group, and x and y are independently an integer of 1 to 3 and wherein a weight ratio of said polyphenol compound (Ib) to said alkali-soluble resin is from 3:10 to 5:10.

2. The positive resist composition of claim 1 wherein said polyphenol compound (Ib) is a compound selected from the group consisting of

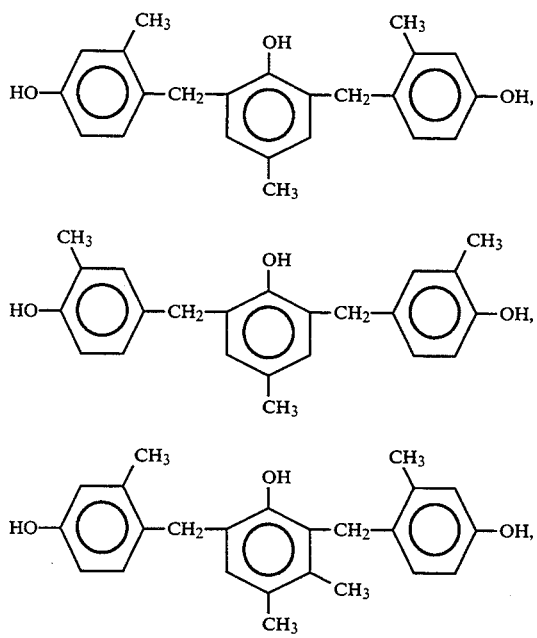

-continued

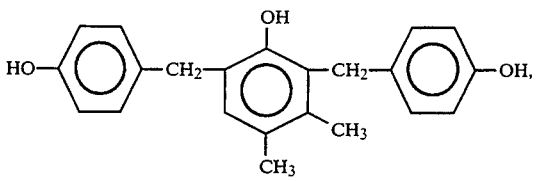

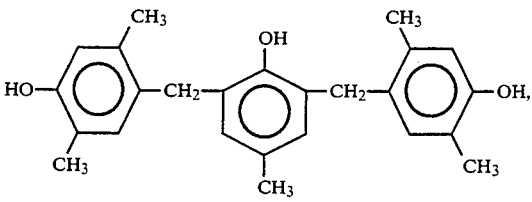

and

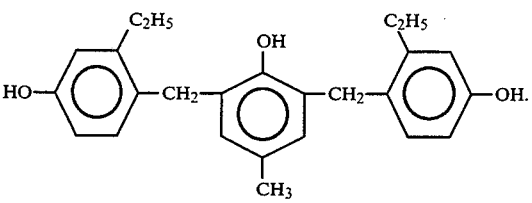

3. The positive resist composition of claim 1 wherein said polyphenol compound (Ib) is present at a concentration of between 30 to 50 parts by weight per 100 parts by weight of said alkali-soluble resin.

4. The positive resist composition of claim 1 wherein said quinonediazide compound is present in a concentration of between 5 to 50% by weight based on the total weight of the solid components of the resist composition.

5. The positive resist composition of claim 1 wherein said alkali-soluble resin is present at a concentration of between 60 to 90% by weight based on the total weight of the solid components of the resist composition.

6. The positive resist composition of claim 1 wherein said alkali-soluble resin containing a novolak resin further comprises at least one additional alkali-soluble resin.

7. The positive resist composition of claim 6 wherein said additional alkali-soluble resin is a polyvinylphenol.

8. The positive resist composition of claim 1 wherein said novolak resin is treated by fractionation to obtain the desired molecular weight range of said novolak resin.

9. The positive resist composition of claim 8 wherein the desired molecular weight range is a weight average molecular weight between 3,000 and 20,000.

* * * * *